United States Patent [19]

Streifer et al.

[11] Patent Number: 4,718,069
[45] Date of Patent: Jan. 5, 1988

[54] SEMICONDUCTOR LASER ARRAY WITH SINGLE LOBED OUTPUT

[75] Inventors: William Streifer, Palo Alto; Donald R. Scifres, San Jose, both of Calif.

[73] Assignee: Spectra Diode Laboratories, Inc., San Jose, Calif.

[21] Appl. No.: 924,195

[22] Filed: Oct. 27, 1986

[51] Int. Cl.⁴ ............................................. H01S 3/19
[52] U.S. Cl. ....................................... 372/50; 372/45; 372/46
[58] Field of Search ....................... 372/44, 46, 50, 45; 357/17

[56] References Cited

U.S. PATENT DOCUMENTS

| Re. 31,806 | 1/1985 | Scifres et al. | 372/50 |
| 4,255,717 | 3/1981 | Scifres et al. | 372/50 |

FOREIGN PATENT DOCUMENTS

| 0081993 | 7/1981 | Japan | 372/46 |
| 0028385 | 2/1982 | Japan | 372/46 |

OTHER PUBLICATIONS

Streifer, et al., "Phased Array Diode Lasers", Laser Focus/Electro-Optics, Jun. 1984.
D. R. Scifres et al; "Semiconductor Lasers with Integrated Interferometric Reflectors"; Applied Physics Letters, vol. 30, No. 11, Jun. 1, 1977; pp. 585–587.

*Primary Examiner*—James W. Davie
*Assistant Examiner*—B. Randolph

[57] ABSTRACT

A semiconductor laser array having a single lobe far field intensity pattern radiating normal to the laser's light emitting facet. The laser array has a plurality of semiconductor layers disposed over a substrate, at least one of the layers forming an active region for lightwave generation and propagation under lasing conditions. A plurality of adjacent spaced apart optical waveguides defined by waveguides and interconnecting waveguides directly couples lightwaves propagating in each waveguide into an adjacent waveguide. The waveguides are characterized by separations which are not equal at the light emitting facet but are selectively varied so that the sampling function has only a single central lobe. In the preferred embodiment, separations are greatest for edge located and smallest for centrally located waveguides. Interconnecting waveguides connect adjacent waveguides at respective Y-shaped junctions, the junctions being symmetric at least on the output side of the laser.

23 Claims, 12 Drawing Figures

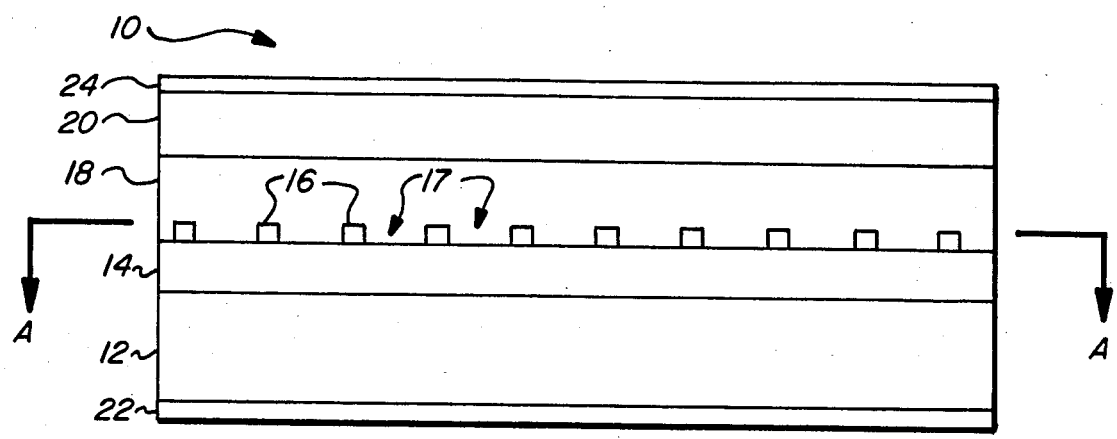
FIG._1.
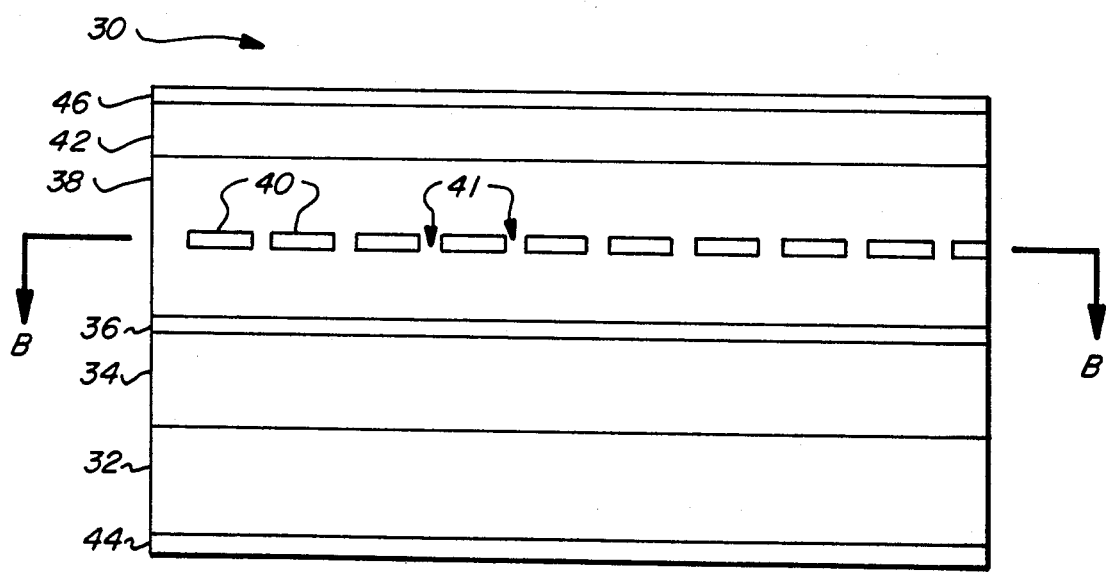
FIG._2.
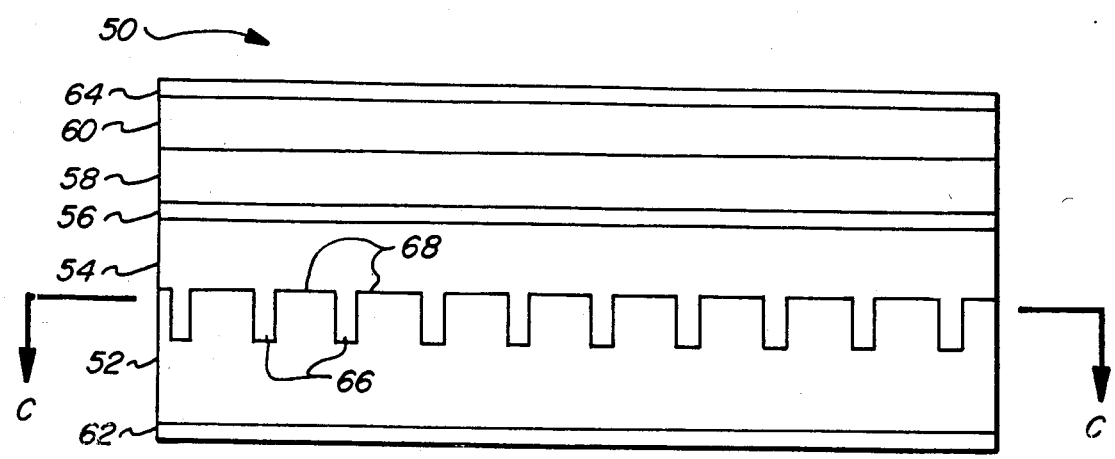
FIG._3.

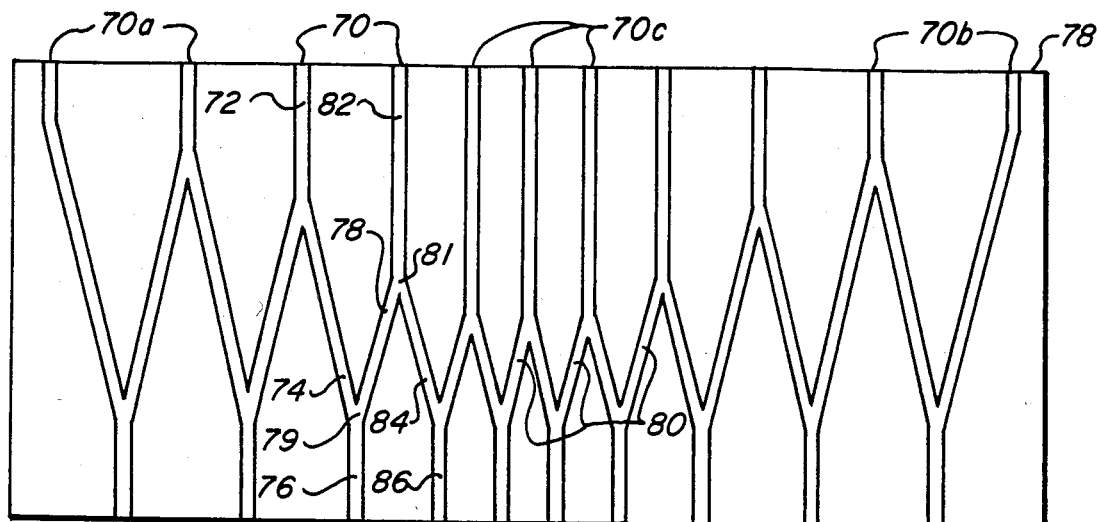
FIG._4.
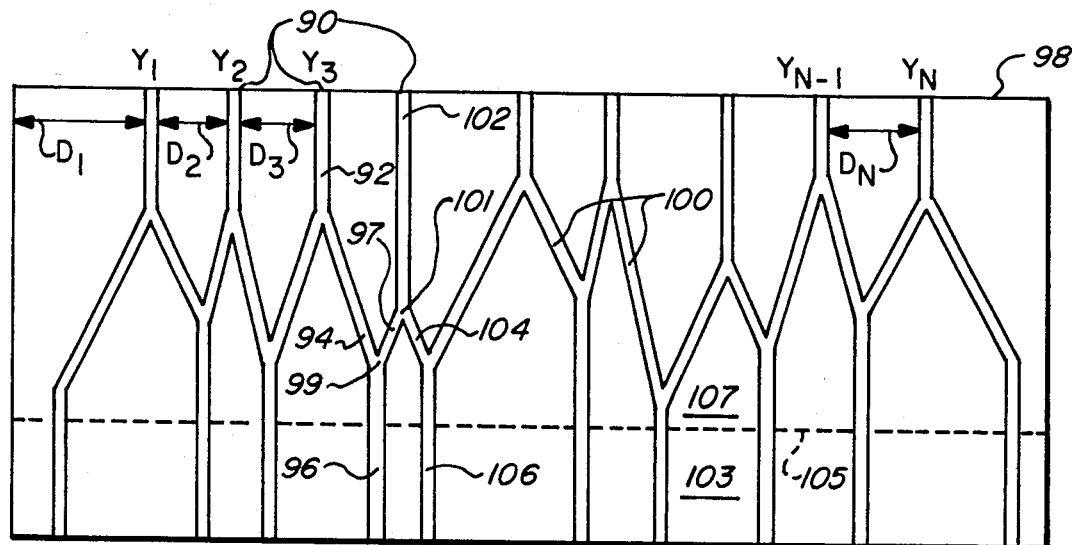
FIG._5.
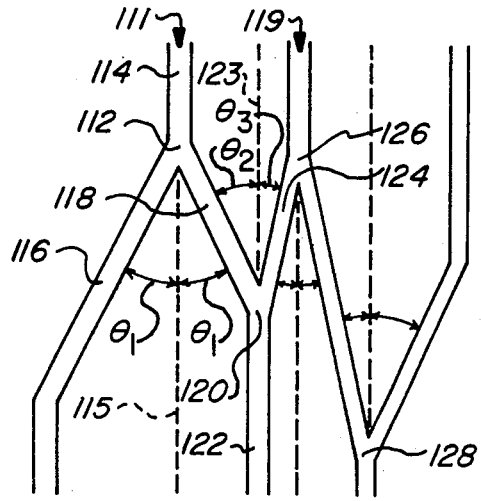
FIG._7.
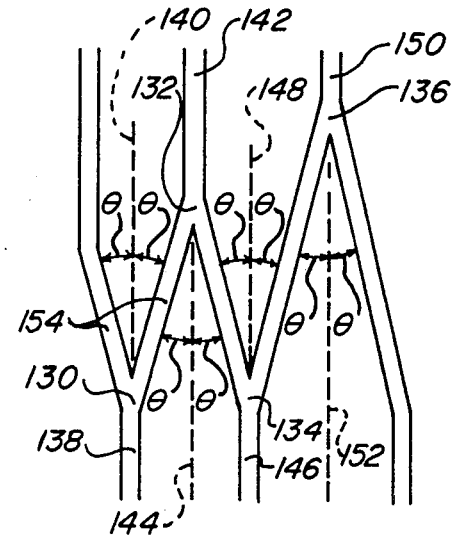
FIG._8.

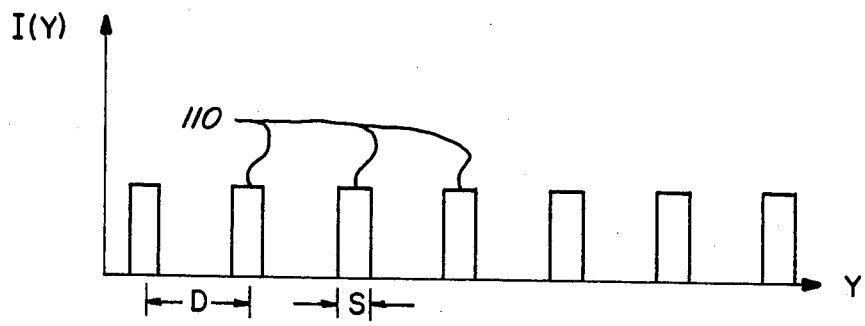
FIG._6A.
*(PRIOR ART)*
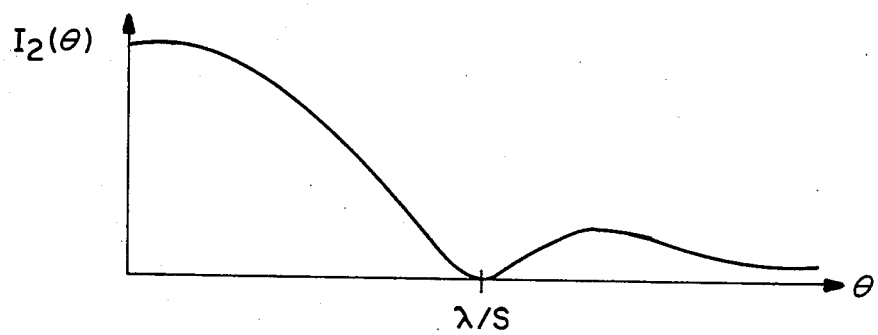
FIG._6B.
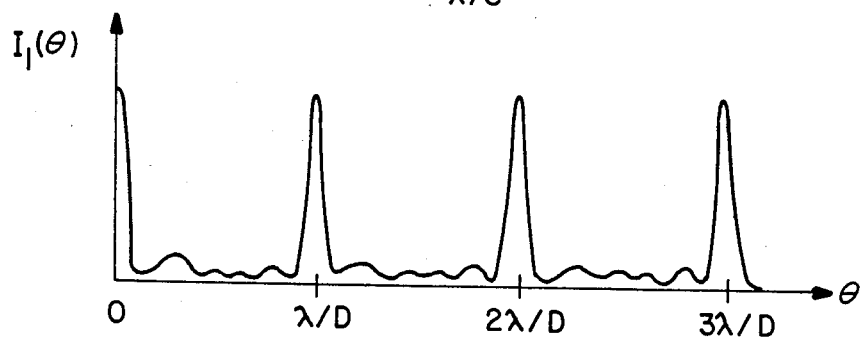
FIG._6C.
*(PRIOR ART)*
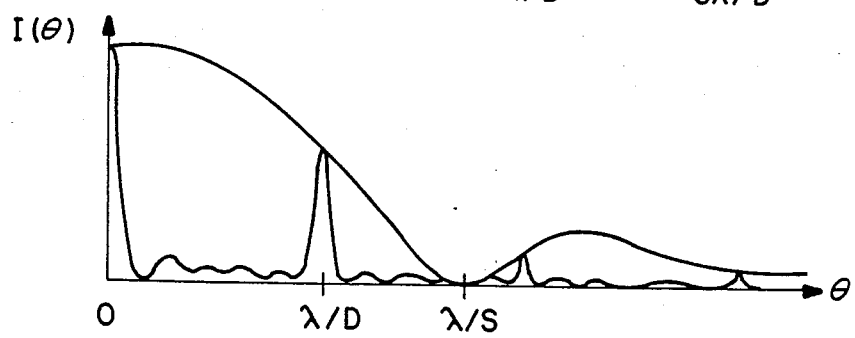
FIG._6D.
*(PRIOR ART)*
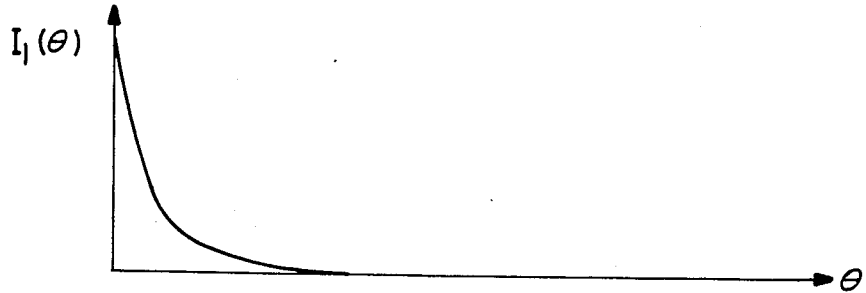
FIG._6E.

SEMICONDUCTOR LASER ARRAY WITH SINGLE LOBED OUTPUT

DESCRIPTION

1. Technical Field

The present invention relates to semiconductor laser arrays and in particular to phased-array semiconductor lasers.

2. Background Art

Many phased-array semiconductor lasers are characterized by a multilobe far field pattern. Gain-guided phased-array lasers which operate up to 350 mW (pulsed) in a single diffraction-limited lobe have been achieved, but the far field radiates at approximately four degrees off the facet normal and steers slightly, about 0.5 degree, with injection current. A single far field lobe radiating normal to the laser facet is desired.

In U.S. Pat. No. 4,255,717, Scifres et al. teach a laser device having a plurality of spatially displaced emitting waveguide cavities in an active layer of a semiconductor body. The waveguides are directly coupled by interconnecting stripes or other structures. Light wave portions propagating in one waveguide will split off and be deflected into an adjacent waveguide where they will combine with lightwave portions propagating in that adjacent waveguide. Out-of-phase modes of the light waves destructively interfere, radiate out of the waveguide and are lost when the waves are recombined. Only the mode in which all emitters are in-phase propagates with minimum loss. The resulting emitted light is typically characterized by three dominant far field lobes, a central lobe and two satellite lobes, caused by constructive interference in the directions of the lobes among the plurality of emitters.

In order to obtain a single far field lobe, it is necessary to suppress or eliminate the two satellite lobes. Referring to FIG. 6A, the near field intensity pattern of emitted light is one of a plurality of individual emitters with spot size S that are located at a center-to-center separation from adjacent emitters by a distance D. The far field intensity pattern, seen in FIG. 6D, is a product of a sampling function in FIG. 6C and an envelope function in FIG. 6B. The sampling function is characterized by a plurality of lobes with angular separations of $\lambda/D$, where $\lambda$ is the wavelength of the emitted light. The envelope function is just the far field intensity pattern for a single emitter and has a central maximum normal to the facet and a first minimum at an angle $\lambda/S$ from the facet normal.

Accordingly, ways in which satellite lobes might be suppressed are by either increasing the spot sizes of the individual emitters thereby narrowing the envelope function, decreasing the center-to-center spacing of the individual emitters thereby increasing the angle at which the satellite lobes radiate, or both until the envelope of the far field intensity pattern encompasses only the central lobe of the sampling function. Unfortunately, in order to achieve a single lobe by this method, the spot size S should be greater than 75% of the separation D. Waveguides which are widened to produce larger spot sizes may support higher order transverse modes. Further, decreasing the spot separation or increasing the spot size leads to evanescent coupling. Higher order transverse modes and evanescent coupling may produce unstable output or an output with two dominant lobes at angles away from the facet normal.

It is an object of the present invention to produce a phased-array semiconductor laser with a single far field lobe output normal to the laser light emitting facet.

DISCLOSURE OF THE INVENTION

The above object has been achieved in a phased-array semiconductor laser with interconnecting waveguides coupling together a plurality of spaced optical waveguides where the separations between the optical waveguides at the light emitting facet are unequal and vary across the laser array. The separations, by a characteristic dimension, are selected so that the beam output pattern is characterized by only a single lobe rather than a plurality of lobes. Then the far field intensity pattern will have only a single central lobe regardless of the relative dimensions of spot size and separation of the emitters. In one embodiment, the separations between adjacent emitters at the facet are smallest for centrally located waveguides and greatest for waveguides located near the edges. This embodiment has the added advantage that optical power is concentrated in the center of the far field laser beam.

The semiconductor laser array of the present invention comprises a plurality of semiconductor layers disposed over a substrate. At least one of the layers forms an active region in proximity to a p-n junction for lightwave generation and propagation under lasing conditions. Electrical contacts on the substrate and the top one of the semiconductor layers apply an electrical forward bias to the layers thereby injecting current and generating lightwaves in the active region. Real refractive index waveguide structures in optical proximity to the active region guide lightwaves in the active region in a plurality of adjacent spaced apart waveguides between a substantially reflective facet and a partially reflective light emitting facet. Interconnecting waveguides couple light into adjacent optical waveguides. Each of the interconnecting waveguides couples two adjacent cavity waveguides at respective Y-shaped junctions, the junctions having a Y-base and two Y-branches. Usually, waveguides having a Y-base leading to the light emitting facet are symmetric, that is, the Y-base defines a bisector of an angle between the Y-branches, but asymmetric junctions may also be utilized, and in some applications may be preferred.

BRIEF DESCRIPTION OF THE DRAWINGS

FIG. 1 is a side plan of a semiconductor laser array of the present invention.

FIG. 2 is a side plan of a second semiconductor laser array of the present invention.

FIG. 3 is a side plan of a third semiconductor laser array of the present invention.

FIG. 4 is a sectional view of a first waveguide geometry taken along the lines A—A in FIG. 1, B—B in FIG. 2 or C—C in FIG. 3.

FIG. 5 is a sectional view of a second waveguide geometry taken along the lines A—A in FIG. 1, B—B in FIG. 2 or C—C in FIG. 3.

FIG. 6A is a graph of near field light intensity versus lateral position across a laser array.

FIGS. 6B-6E are graphs of far field light intensity versus angular position across a laser array.

FIG. 7 is an enlarged view of the second waveguide geometry in FIG. 5.

FIG. 8 is an enlarged view of the first waveguide geometry in FIG. 4.

BEST MODE FOR CARRYING OUT THE INVENTION

With reference to FIG. 1, a semiconductor laser array 10 comprises a substrate 12 upon which are successively disposed layers 14, 16, 18 and 20 of semiconductor material. Likewise, a semiconductor laser array 30 in FIG. 2 comprises semiconductor layers 34, 36, 38, 40 and 42 disposed over a substrate 32, and a semiconductor laser array 50 in FIG. 3 comprises a plurality of semiconductor layers 54, 56, 58 and 60 which are successively disposed over a substrate 52. Laser arrays 10, 30 and 50 are preferably fabricated on a wafer substrate by metal-organic chemical vapor deposition, but may also be fabricated by liquid phase epitaxy, molecular beam epitaxy or other known crystal growth processes.

Substrates 12, 32 and 52 are typically composed of n-GaAs. Cladding layers 14, 34 and 54 are typically composed on $n-Ga_{1-x}Al_xAs$, where x is usually in the range from 0.3 to 0.4 with a doping level of about $8 \times 10^{17}$ cm$^{-3}$(Se) and a thickness greater than 1.0 $\mu$m. Cladding layers 18, 38 and 58 are typically composed of $p-Ga_{1-z}Al_zAs$, where z is in the range from 0.3 to 0.4 and preferably equal to x, noted above, and the doping level is about $2 \times 10^{18}$ cm$^{-3}$(Mg). The thickness of p-type cladding layers 18 and 58 should be approximately 1.5 $\mu$m. The portion of cladding layer 38 below blocking layer 40 in FIG. 2 is typically about 0.25 to 0.5 microns thick, while the portion of cladding layer 38 above block layer 40 is typically about 1.5 $\mu$m thick. Cap layers 20, 42 and 60 are typically composed of p-GaAs with a doping level of about $10^{19}$ cm$^{-3}$(Zn) and a thickness of about 0.3 $\mu$m.

Layers 16, 36 and 56 are not intentionally doped and might consist of four 0.012 $\mu$m thick quantum wells of $Ga_{0.95}Al_{0.05}As$ alternating with three 0.006 $\mu$m barriers of $Ga_{0.80}Al_{0.20}As$. Such quantum-well structures are known and described in an article by N. Holonyak, Jr., et al. entitled "Quantum-well Heterostructure Lasers" in IEEE Journal of Quantum Electronics, vol. QE16, no. 2 (Feb. 1980), pp. 170-186. Alternatively, instead of a plurality of thin layers in a quantum-well or multiple-quantum-well heterostructure, layers 16, 36 and 56 may be formed from a single layer of $Ga_{1-y}Al_yAs$ where y is typically less than 0.1. In either case, layers 16, 36 and 56, with the highest index of refraction and the lowest band gap, form an active region for lightwave generation and propagation under lasing conditions.

It will of course be recognized that the conductivity type of the layers may be reversed from those noted above. Likewise, instead of GaAs and GaAlAs, other light emitting semiconductor materials, such as GaAlSb, InP, InGaAsP, other III-V alloys, II-VI alloys and IV-VI alloys may be used. Moreover, the dimensions, doping levels, and dopants mentioned above are exemplary only.

Laser arrays 10, 30 and 50 are provided with conductive contact layers 22 and 24, 44 and 46, and 62 and 64 respectively. Conductive contact layers provide a metallization for electrode connection for forward biasing of the laser arrays and current injection whereby light is generated in active regions 16, 36 and 56. Layers 22, 44 and 62 are deposited on substrates 12, 32 and 52 respectively and are typically composed of Au/Ge alloy. Layers 24, 46 and 64 are deposited on cap layers 20, 42 and 60 respectively and are typically composed of Ti/Pt/Au.

Each of the laser arrays 10, 30 and 50 has waveguides in optical proximity to the active region 16, 36 and 56 respectively which define a plurality of adjacent spaced apart optical cavities. In addition to waveguides, each of the laser arrays also has interconnecting waveguides for coupling cavities together. In FIG. 1, waveguide structures are provided by an active region 16, which is of nonuniform thickness. In FIG. 2, waveguides are provided by a blocking layer 40 which is of nonuniform thickness. In FIG. 3, waveguides are provided by the groove pattern in substrate 52.

In FIG. 1, active region 16 is of nonuniform thickness. Gaps 17 are areas where active region 16 has been selectively etched away, possibly to zero thickness, then filled with material from cladding layer 18. Layer 18 has a lower index of refraction and higher band gap than active region 16, thereby causing light waves to be guided along the thicker portions of active region 16 which remain after etching. Thus, optical emitting cavities are defined at thick portions of active region 16 where no etching has occurred.

In order to produce this waveguide structure, a 0.05 $\mu$m GaAs layer is deposited after growing 0.3 $\mu$m of p-type cladding layer 18 to passivate the surface. A desired pattern of waveguides, such as those seen in FIGS. 4 and 5, is then defined by optical lithography in a photoresist layer deposited over the passivation layer. After pattern definition, the wafer is etched in a standard etchant solution. The etch time is calibrated so that the etch goes through active region 16. Typical etch rates for this solution are 0.4 $\mu$m/min., resulting in etch times of approximately 50 sec to etch through the 0.3 $\mu$m p-type cladding layer 18 and the 0.066 $\mu$m active region 16. Typically the remaining portions of active region 16 are about 1.5 $\mu$m wide. The photoresist layer is then stripped off with a solvent, such as acetone, and the wafer is etched again for 10 seconds in the same etch solution to remove the GaAs passivation layer and to produce a clean surface for crystal growth. Cladding layer 18 is then regrown with the same semiconductor material as before. Finally, cap layer 20 is grown. The above procedures, dimensions, etc. are indicative only; they are be no means exclusive.

In FIG. 2, emitting cavities are defined by current confining channels 41 in a light absorbing current blocking layer 40 in optical proximity to active region 36. Unlike active region 16, active region 36 is of a generally uniform thickness. A portion of p-type cladding layer 38, typically about 0.25 $\mu$m to 0.5 $\mu$m thick, is disposed over active region 36. Blocking layer 40 is disposed over the lower portion of cladding layer 38 and is typically composed of n-type GaAs. After growing the blocking layer, gaps or channels 41 are selectively etched in a desired pattern, such as those seen in FIGS. 4 and 5, through blocking layer 40. The pattern definition and etching steps are similar to those described above for active region 16, except that etch times are typically shorter, depending on the thickness of blocking layer 40. Finally, the remainder of cladding layer 38, typically about 1.5 $\mu$m thick, is disposed over the etched blocking layer, the semiconductor material of cladding layer 38 filling the gaps 41 in blocking layer 40.

Since cladding layer 38 beneath blocking layer 40 is composed of p-type semiconductor material and blocking layer 40 is composed of n-type semiconductor material, blocking layer 40 acts as a barrier to injected current. Accordingly, current flow and laser gain are confined to those portions of active region 36 directly beneath gaps 41. Further, since cladding layer 38 is composed of GaAlAs and blocking layer 40 is composed of GaAs, the pattern of gaps or channels 41 form real refractive index waveguides, light waves being absorbed by blocking layer 40 except where gaps 41 are present.

In FIG. 3, channels 66 in substrate 52 define optical cavities in active region 56 by means of refractive index changes with which light waves propagating in active region 56 interact. A desired waveguide pattern, such as those in FIGS. 4 and 5, is defined and etched in the manner described above for active region 16 and blocking layer 40. The semiconductor layers 54, 56, 58 and 60 are then successively disposed over the channelled substrate 52. Channels 66 are thus filled with semiconductor material of cladding layer 54, while areas 68 adjacent to channels 66 are composed of substrate material. Since substrate 52 is typically GaAs with an index of refraction of about 3.6 and cladding layer 54 is typically GaAlAs with an index of refraction of about 3.4, optical power above regions 68 between the channels 66 leaks into substrate 52 and is absorbed. In this manner, optical waveguides are defined in active region 56 above channels 66 where losses are lowest.

A major aspect of the present invention relates to the spacing or separation between adjacent optical waveguides defined by the waveguide structures described above. Any of the laser arrays in FIGS. 1–3 or other means of creating waveguides may be used with this invention. Further, laser arrays having other waveguide structures or combinations of the above described wavesguide structures may be used. In choosing a waveguide structure to be used in laser arrays of the present invention, direct coupling of light waves in adjacent optical waveguides by interconnecting waveguides at Y-shaped junctions, described in greater detail below, should probably be stronger than evanescent coupling. Evanescent coupling is due to interaction of overlapping light waves propagating in adjacent cavities and is strongly dependent on the separation between the cavities. Because direct coupling at the Y-junctions is essentially independent of cavity separations, the optical cavities may be positioned at any location along the laser output facets.

With reference to FIG. 4, a plurality of adjacent spaced waveguides 70 guide lightwaves between a partially reflective light emitting facet 78 and a substantially reflective facet 88. A plurality of interconnecting waveguides 80 couples lightwaves propagating in each of the optical waveguides 70 to adjacent optical waveguides. Each interconnecting waveguide 80 connects two adjacent waveguides 70 at respective Y-shaped junctions. For example, a waveguide comprising an end portion 72, a center portion 74 and a second end portion 76 connects to interconnecting waveguide 78 at a Y-shaped junction 79 between portions 74 and 76. Interconnecting waveguide 78 also connects to a waveguide 70 comprising an end portion 82, a center portion 84 and a second end portion 86 at a Y-shaped junction 81 between portions 82 and 84.

Similarly, in FIG. 5 a plurality of adjacent spaced waveguides 90 guides lightwaves between partially reflective light emitting facet 98 and a substantially reflective facet 108, and interconnecting waveguides 100 couple lightwaves propagating in each of the parallel waveguides to adjacent waveguides. A waveguide comprising an end portion 92, a center portion 94 and a second end portion 96 is coupled to an adjacent waveguide comprising end portion 102, center portion 104 and a second end portion 106 by interconnecting waveguide 97 at respective Y-shaped junctions 99 and 101.

In FIGS. 4 and 5, waveguides 70 and 90 and interconnecting waveguides 80 and 100 are typically about 1.5 μm wide. In order to best control the far field radiation pattern a single mode waveguide along at least a portion of the length of the waveguide is preferred. End portions of waveguides 70 and 90 leading to light emitting facets 78 and 98, such as end portions 72, 82, 92, and 102 may be of equal width so as to support the same mode pattern. Y-coupling regions comprising center portions of waveguides, such as center portions 74, 84, 94 and 104, and interconnecting waveguides 80 and 100, typically have a length of about 100 μm. Long Y-coupling regions are necessary to establish good Michelson interferometer function to eliminate out-of-phase components of propagating light waves, as well as to ensure that interconnecting waveguides 80 and 100 connect to waveguides at an angle which is less than about five degrees to minimize losses.

In FIG. 5, a "window" portion 103 of the semiconductor laser array below dashed line 105 is transparent to radiation generated in the electrically excited active portion 107 above dashed line 105. Window portions 103 which typically occur at an end of a laser array near a light emitting facet 108 are generally not pumped or electrically excited thereby forming a passive array to which parallel active waveguides 90 couple. The interconnecting waveguides 100 may be within the active electrically excited portion 107, as shown, or the boundary 105 of the window portion may be further from facet 108 to include interconnecting waveguides 100. Window portions 103 can be made transparent to the wavelength of radiation from the active portion by, for example, impurity induced disordering. In this process the active region comprises a series of very thin quantum wells made up of alternate layers of GaAs and GaAlAs. An impurity, such as silicon or zinc, is introduced into the active region, then the wafer is heated to diffuse the impurity. During heating the GaAs and GaAlAs layers mix to produce a uniform smearing of the Al content in the active region. The smeared or mixed region in the passive array which is formed has a wider bandgap and is transparent to the longer wavelengths generated by the active region in the electrically excited portions of the semiconductor laser array. Other methods of forming transparent windows include etching away the active region and regrowing a new layer with a wider effective bandgap, and diffusing p-type dopant into an n-type active region. Window portions are not essential to the operation of the present invention but may be preferred in some applications, such as to prevent damage to the mirror facets 108.

The separations between adjacent waveguides 70 and 90 at light emitting facets 78 and 98 respectively are not equal. In FIG. 4, the separations are greatest for edge located waveguides 70a and 70b and smallest for centrally located waveguides 70c. Typically, the edge waveguides 70a and 70b are separated from adjacent waveguides by a distance which is about 5 to 20 μm, and the center waveguides 70c are separated by about 2 to 5 μm. The smaller separations for center waveguides 70c may be used provided the regions between the waveguides are sufficiently absorbing or scatter light sufficiently to prevent evanescent coupling along at least a portion of the length of the waveguide. The variation of waveguide separations from center to edge may be linear, sinusoidal, or some other function. The separations between adjacent waveguides 70 or 90 at the substantially reflective rear facet 88 and 108 respectively are not critical and may be uniform or vary. In FIG. 5, the separations are somewhat random and represent a more general case.

With reference to FIGS. 5 and 6, the separations between waveguides are selected so that the sampling function $I_1(\theta)$ has a single lobe, such as in FIG. 6E. In FIG. 6A, the near field intensity pattern $I(y)$ for the prior art shows a plurality of individual emitters 110 of equal intensity and width S, on centers separated by a distance D. The size and placement of these emitters correspond closely to the placement and width of waveguides at the light emitting facet. The resulting far field intensity pattern $I(\theta)$, seen in FIG. 6D, is a product of the sampling function $I_1(\theta)$ seen in FIG. 6C and the envelope function $I_2(\theta)$ seen in FIG. 6B. The envelope function $I_2(\theta)$ is just the far field intensity pattern for a single emitter of width S and wavelength $\lambda$.

In the general case, seen in FIG. 5, N emitters (i=1, 2, ..., N) are located along the light emitting facet 98 at positions $Y=Y_i$ and whose centers are separated from adjacent emitters by distances $D_1, D_2, \ldots, D_N$. If each of the waveguides produces emitters of the same width S, then each of the optical cavities will support the same mode pattern and each of the emitters can be characterized by an intensity function, $$I_i(y) = A_i f(y-y_i), \quad (1)$$

where $A_i$ is the peak intensity of emitter i and $f(y-y_i)$ is the normalized mode pattern of emitter i.

The near field intensity pattern $I(y)$ is the sum of the individual emitters' contributions, i.e.

$$I(y) = \sum_{i=1}^{N} A_i f(y-y_i) \quad (2)$$

The far field intensity pattern $I(\theta)$ is then $$I(\theta) \propto \sum_{i=1}^{N} A_i \int f(y-y_i) e^{ik_0 y \sin\theta} dy, \quad (3)$$

Where $k_o = 2\pi/\lambda$, $\lambda$ is the wavelength of emitted light, and $\theta$ is the angle of light wave radiation relative to the normal from the light emitting facet 98. Defining the following relations:

$$y - y_i = y - \sum_{l=1}^{i} D_l = y - \delta_i = \mu_i,$$

where $D_l$ is the distance between emitter l−1 and emitter l, equation (3) becomes $$I(\theta) \propto \sum_{i=1}^{N} A_i \int f(\mu_i) e^{ik_0\mu_i\sin\theta} e^{ik_0\delta_i\sin\theta} d\mu_i, \quad (4)$$

and finally $$I(\theta) \propto \sum_{i=1}^{N} A_i e^{ik_0\delta_i\sin\theta} F_i(\theta), \text{ where } F_i(\theta) = \int f(\mu_i) e^{ik_0\mu_i\sin\theta} d\mu_i, \quad (5)$$

the far field radiation pattern of a single emitter, i.e. the envelope function $I_2(\theta)$ seen in FIG. 6B, and the first term is the sampling function $I_1(\theta)$. By designing the positions $\delta_i$ and the amplitudes $A_i$ of the various emitters, one may obtain a sampling function that includes only one lobe.

EXAMPLE

Consider a laser array in which the emitters have constant amplitude A and separations which alternate between $D_1$ and $D_2$. Using the defining relations $D_0 = D_1 + D_2$ and $u = k_0 \sin\theta$, the sampling function $I_1(\theta)$ becomes:

$$I_1(\theta) = \sum_{i=1}^{N} A_i e^{ik_0\delta_i\sin\theta} \quad (6)$$

$$= A \sum_{i=1}^{N} e^{iu\delta_i}$$

$$= A[1 + e^{iuD_1} + e^{iuD_0} + e^{iu(D_0+D_1)} + e^{iu2D_0} + \ldots]$$

$$= \frac{A(1 + e^{iuD_1})\left(1 + e^{iuD_0(\frac{N}{2}+1)}\right)}{(1 - e^{iuD_0})}$$

The result is shown in FIG. 6E and has only a single lobe. The variation used in this example is not considered to be the best mode, since other embodiments including the one shown in FIG. 4 have a single lobe sampling function $I_1(\theta)$ with a smaller width or divergence.

With reference to FIG. 7, each of the Y-shaped junctions 112, 120, 126 and 128 has a Y-base and two Y-branches. For example, Y-shaped junction 112 has a Y-base 114 and Y-branches 116 and 118. In order to maintain the light waves at the light emitting facet of the laser in-phase relative to one another, it is preferred that all Y-shaped junctions on the output side of the laser be symmetric. This will lead to a low loss mode of operation that produces a fundamental mode emission pattern. By "symmetric" is meant that the Y-bases leading to the light emitting facet, such as Y-base 114, define a bisector 115 of the angle between Y-branches 116 and 118. Thus, in FIG. 7 it is seen that bisector 115 extending from Y-shaped junction 112 parallel to Y-base 114 divides the angle between Y-branches 116 and 118 into two equal angles $\theta_1$. Y-shaped junction 126 may be seen to be also symmetric. Typically, the lengths of interconnecting waveguides, such as waveguide 118, are about 100 $\mu$m, and the separations between adjacent waveguide centers, such as waveguides 111 and 119, are from 4 to 15 $\mu$m. Thus, angle $\theta_1$, is not larger than about five degrees.

Since the spacing between waveguides is varied to suppress side lobes, the Y-shaped junctions on the non-output side of the laser, i.e. Y-shaped junctions whose Y-bases lead toward the substantially reflective rear facet of the laser, may be asymmetric. Thus, in FIG. 7, Y-shaped junction 120 has a Y-base 122 defining a line 123 which does not bisect the angle between Y-branches 118 and 124. Line 123 extending from Y-shaped junction 120 parallel to Y-base 122 divides the angle between Y-branches 118 and 124 into two unequal angles $\theta_2$ and $\theta_3$. Y-shaped junction 128 is also asymmetric.

Asymmetric Y-shaped junctions cause light propagating in the Y-base portion of the waveguide to be unevenly divided between the two Y-branches, possibly leading to unequal amplitudes among the plurality of emitters. Thus, the angles of branching $\theta_2$ and $\theta_3$ may be manipulated according to equation (6) above to produce a sampling function having a single lobe.

Asymmetric Y-shaped junctions also cause the two Y-branches to be of unequal length. This can lead to a high loss at the junction unless the difference in path lengths in the two branches is an integral number of half-wavelengths. Since the angle between Y-branches is kept small, the achievable difference in path length over a distance of about 100 $\mu$m will be at most a few half-wavelengths. Thus, it is desirable to choose the variation in the guide spacing to approximate as closely as possible the multiple half-wavelength path length variation from waveguide to waveguide. This variation can be made on the non-output side of the laser leaving the spacings on the output side in their desired postions. Further, the lengths of the Y-coupling regions, i.e. the lengths of the interconnecting waveguides 118 and the central portions 116 and 124 of the cavity waveguides 111 and 119 can be varied to produce the required path length differences.

An additional advantage of the path length differences introduced by asymmetric Y-shaped junctions is that the junctions will function as Mach-Zehnder interferometers that will resonate only at a discrete set of wavelengths. Only those wavelengths in which the path length differences along the Y-branches are multiples of one-half wavelength will resonate leading to a laser array with a stable wavelength output.

In FIG. 8, all Y-shaped junctions 130, 132, 134 and 136 are symmetric. Each junction has a Y-base 138, 142, 146 or 150 which defines a bisector 140, 144, 148 or 152 respectively of the angle between respective Y-branches. Each bisector divides the angle between the Y-branches into two equal angles $\theta$. This can be achieved in a laser array with variably spaced waveguides by varying the lengths of the interconnecting waveguides and center portions 154. Symmetric junctions on both the output side and non-output side have been used in the preferred embodiment in FIG. 4. Because symmetric junctions are used, all of the emitters have the same output intensity, and because of the length variations in the Y-coupling region, the laser is wavelength selective.

The above described invention achieves the desired goal of a single lobe far field output normal to the laser light emitting facet by selectively varying the separations between the plurality of adjacent waveguides. Selection is made so that the sampling function in equation (6) has only a single central lobe. An additional advantage of stability in the output wavelength is also achieved. It will of course be recognized that the preferred embodiment shown in FIG. 4 is not the only possible variation that satisfies the single lobe sampling function requirement, and accordingly these other variations may also be used.

We claim:

1. A semiconductor laser array comprising,
   a plurality of semiconductor layers disposed over a substrate, at least one of said layers forming an active region for lightwave generation and propagation under lasing conditions,
   means for applying an electrical forward bias to said layers thereby generating lightwaves in said active region,
   means for guiding said lightwaves in a plurality of spaced apart optical waveguides, said waveguides extending between reflective facets, and
   interconnecting waveguide means optically communicating between adjacent optical waveguides for coupling lightwaves propagating in each of said optical waveguides into adjacent optical waveguides,
   said plurality of adjacent spaced apart optical waveguides being characterized by separations between adjacent waveguides that at said light emitting facet are substantially unequal whereby light emitted from said optical waveguides at said light emitting facet has a single far field lobe radiating from said light emitting facet.

2. The semiconductor laser array of claim 1 wherein said means for guiding lightwaves in a plurality of adjacent spaced apart optical waveguides comprises a plurality of adjacent waveguides defined in at least one of said substrate and said plurality of semiconductor layers with which said lightwaves interact.

3. The semiconductor laser array of claim 2 wherein each of said interconnecting waveguides couples two adjacent waveguides at respective Y-shaped junctions, said Y-shaped junctions having a Y-base and two Y-branches.

4. The semiconductor laser array of claim 1 wherein the separations between adjacent waveguides at the light emitting facet are smallest for centrally located optical waveguides and greatest for edge located optical waveguides.

5. The semiconductor laser array of claim 3 wherein each of said Y-shaped junctions having a Y-base leading to said light emitting facet is symmetric, said Y-base defining a bisector of an angle between said Y-branches.

6. The semiconductor laser of claim 1 wherein a sampling function $I_1(\theta)$ has only a single lobe where $$I_1(\theta) = \sum_{i=1}^{N} A_i e^{ik_o \delta_i \sin\theta},$$

there being N light emitting optical waveguides (i), $A_i$ being the amplitude of light emitted from a particular optical waveguide i, $\delta_i$ being the position of a particular optical waveguide i relative to an arbitrary point on said light emitting facet, $\theta$ being the angle of light radiation in the far field relative to a line normal to the light emitting facet, and where $k_o = 2\pi/\lambda$, $\lambda$ being the wavelength of emitted light.

7. The semiconductor laser array of claim 1 wherein said means for guiding comprises changes in thickness of one or more of said layers.

8. The semiconductor laser array of claim 1 wherein said means for guiding comprises gaps in a blocking layer spaced proximately to said active region.

9. The semiconductor laser array of claim 1 wherein said means for guiding comprises channels etched into said substrate.

10. The semiconductor laser array of claim 1 wherein said means for guiding comprises changes in composition of one or more of said layers.

11. The semiconductor laser array of claim 1 wherein said optical waveguides form a single mode waveguide along at least a fraction of their length.

12. A semiconductor laser array comprising,
    a plurality of semiconductor layers disposed over a substrate, at least one of said layers forming an active region for lightwave generation and propagation under lasing conditions, means for applying an electrical forward bias to said layers thereby generating lightwaves in said active region, a plurality of adjacent spaced apart waveguides formed in at least one of said substrate and said plurality of semiconductor layers with which said lightwaves interact, lightwaves generated in said active region being propagated in said waveguides between reflective facets, and a plurality of interconnecting waveguides coupling lightwaves propagating in each of said waveguides into adjacent waveguides, each of said interconnecting wavesguides coupling to two adjacent waveguides at respective Y-shaped junctions, wherein said pluality of waveguides are characterized by separations between adjacent waveguides that are unequal at said light emitting facet.

13. The semiconductor laser array of claim 12 wherein the separations between adjacent optical waveguides at the light emitting facet are smallest for centrally located optical waveguides and greatest for edge located optical waveguides.

14. The semiconductor laser array of claim 13 wherein said separations vary linearly from said centrally located optical waveguides to said edge located optical waveguides.

15. The semiconductor laser array of claim 13 wherein said separations vary sinusoidally from said centrally located optical waveguides to said edge located optical waveguides.

16. The semiconductor laser array of claim 12 wherein each of said Y-shaped junctions having a Y-base leading to said light emitting facet is symmetric, said Y-base defining a bisector of an angle between said Y-branches.

17. The semiconductor laser array of claim 12 wherein said waveguides and said interconnecting waveguides comprise changes in thickness of one or more of said layers.

18. The semiconductor laser array of claim 12 wherein said waveguides and said interconnecting waveguides comprise gaps in a blocking layer spaced proximately to said active region.

19. The semiconductor laser array of claim 12 wherein said waveguide and said interconnecting waveguides comprise channels etched into said substrate.

20. The semiconductor laser array of claim 12 wherein said means for guiding comprises changes in composition of one or more of said layers.

21. The semiconductor laser array of claim 12 wherein said optical waveguides form a single mode waveguide along at least a fraction of their length.

22. The semiconductor laser array of claim 12 further comprising one or more passive window portions of said array which are transparent to radiation from portions of said array which are electrically excited.

23. The semiconductor laser array of claim 12 wherein a sampling function $I_1(\theta)$ defined by the equation $$I_1(\theta) = \sum_{i=1}^{N} A_i e^{ik_o \delta_i \sin\theta}$$

has only a single lobe,

N being the number of plural spaced apart waveguides, A being the amplitude of light emitted from a particular optical waveguide i, $\delta_i$ being the position of a particular optical waveguide i relative to an arbitrary point on said light emitting facet, $\theta$ being the angle of light radiation in the far field relative to a line normal to the light emitting facet, and where $k_o = 2\pi/\lambda$, $\lambda$ being the wavelength of emitted light.

* * * * *